United States Patent [19]

Suzuki

[11] Patent Number: 4,710,904
[45] Date of Patent: Dec. 1, 1987

[54] CONSTANT PULSE WIDTH GENERATOR INCLUDING TRANSITION DETECTORS

[75] Inventor: Atsushi Suzuki, Yokohama, Japan

[73] Assignee: Fujitsu Limited, Kawasaki, Japan

[21] Appl. No.: 767,873

[22] Filed: Aug. 21, 1985

[30] Foreign Application Priority Data

Aug. 23, 1984 [JP] Japan ............................. 59-175392

[51] Int. Cl.$^4$ .................................................. G11C 7/00
[52] U.S. Cl. ..................................... 365/226; 365/203; 365/230; 307/265; 307/603; 328/111
[58] Field of Search ............... 365/230, 190, 203, 226, 365/233; 307/265, 449, 451, 463, 234, 603; 328/58, 111

[56] References Cited

U.S. PATENT DOCUMENTS

| | | | |
|---|---|---|---|
| 4,417,328 | 11/1983 | Ochii | 365/203 |
| 4,425,514 | 1/1984 | Orr et al. | 307/265 |
| 4,571,510 | 2/1986 | Seki et al. | 307/449 |
| 4,583,008 | 4/1986 | Grugett | 307/265 |
| 4,614,883 | 9/1986 | Sood et al. | 307/265 |

Primary Examiner—Stuart N. Hecker
Assistant Examiner—Glenn A. Gossage
Attorney, Agent, or Firm—Staas & Halsey

[57] ABSTRACT

A semiconductor circuit for generating a pulse with a constant pulse width regardless of the pulse widths of the input signals, including a pulse-width fixing circuit for latching the output signal of a gate circuit when an input signal received by the gate circuit changes. The pulse width fixing circuit unlatches the gate circuit a predetermined time after the latching.

8 Claims, 11 Drawing Figures

Fig. 3
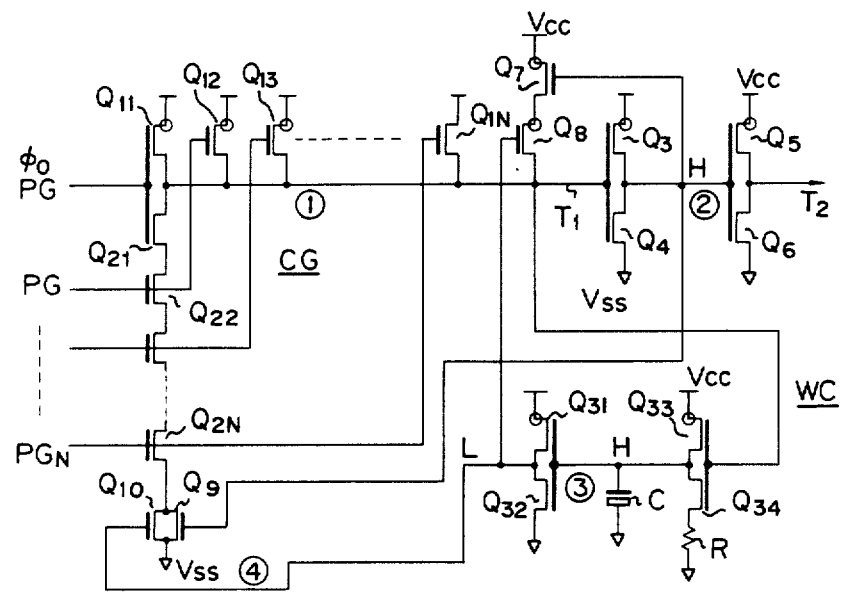
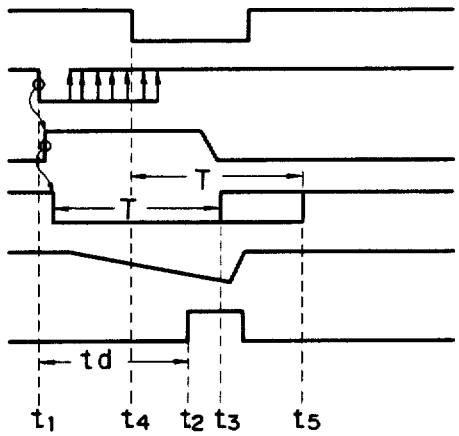
Fig. 4A $\phi_0$
Fig. 4B $\phi_1$
Fig. 4C ①
Fig. 4D ②
Fig. 4E ③
Fig. 4F ④

CONSTANT PULSE WIDTH GENERATOR INCLUDING TRANSITION DETECTORS

BACKGROUND OF THE INVENTION (1) Field of the Invention

The present invention relates to a semiconductor circuit, more particularly, to a circuit applied in, for example, a static semiconductor memory for generating a clock signal when an input signal, such as the address signal, changes.

(2) Description of the Related Art

A static memory generally does not need a clock signal, in contrast to a dynamic memory, which always needs a clock signal. Some special static memories, however, use clock signals to represent address changes, write instructions, or power downs, to decrease the access time, and so forth. Prior art static memories employing clock signals are disclosed in, for example:

Japanese Unexamined Patent Publication (Kokai) No. 57-69586, published on Apr. 28, 1982, filed on Oct. 15, 1980, inventor: Atsushi Oritani, applicant: Fujitsu Limited;

Japanese Unexamined Patent Publication No. 58-3186, published on Jan. 8, 1983, filed on June 30, 1981, inventor: Atsushi Oritani, applicant: Fujitsu Limited;

Japanese Unexamined Patent Publication No. 58-41485, published on Mar. 10, 1983, filed on Sept. 1, 1981, inventor: Keizo Aoyama, applicant: Fujitsu Limited;

Japanese Unexamined Patent Publication No. 58-41486, published on Mar. 10, 1983, filed on Sept. 1, 1981, inventor: Keizo Aoyama, applicant: Fujitsu Limited;

Japanese Unexamined Patent Publication No. 59-3783, published on Jan. 10, 1984, filed on June 30, 1982, inventor: Atsushi Oritani, applicant: Fujitsu Limited;

Japanese Unexamined Patent Publication No. 59-63091, published on Apr. 10, 1984, filed on Sept. 30, 1982, inventor: Eiji Noguchi, applicant: Fujitsu Limited; and Japanese Unexamined Patent Publication No. 59-63094, published on Apr. 10, 1984, filed on Oct. 4, 1982, inventor: Keizo Aoyama et al, applicant: Fujitsu Limited.

In the static memories using the clock signals, when a memory cell of the static memory is accessed, a bit-line pair is temporarily short-circuited to be the same potential by applying a clock signal and then is changed to a high level (H) or a low (L) level in accordance with the data stored in the memory cell. This decreases the access time in comparison with a circuit not using a clock signal, wherein the change is effected from an H or L state, depending on the stored data previously read, to an H or L state, depending on the stored data which is to be currently read. This short-circuiting is also effected in a sense amplifier, wherein the response speed for currently read data is increased by resetting the output signals by the clock signal before starting the operation of the sense amplifier.

A clock signal representing a change of an input signal, such as an address signal, is conventionally generated by taking a logical OR of pulses generated by changes of respective input signals. For example, the address signals used for the input signals are 10 bits in a 1K-memory, 11 bits in a 2K-memory, and so forth. From each bit of the address signals, a complementary pair of bit $\overline{A_i}$ and its inverted bit $A_i$ ($i = 0, 1, 2, \ldots$) is obtained, which are input to a decoder to act as a signal for selecting a word line or a bit line. A pulse generating circuit for each of the above-mentioned pulses is provided in an address inverter. The pulse generated from the pulse generating circuit is supplied to the OR gate for obtaining the above-mentioned logical OR.

However, the clock signal thus generated has a problem in that, when the rising time and the falling time of the input siganls are indefinite, the width of the clock signal changes depending on the input signals. When the input signals are input address signals, this problem is caused because (1) since the address inverters and, accordingly, the above-mentioned pulse generating circuits are spread over a certain area of a memory chip, the wiring lengths between each pulse generating circuit and the OR gate are different from each other, so that the timings of the output pulses reaching the OR gate are slightly different; (2) since the pulses output from the respective pulse generating circuits do not always have the same pulse widths, the pulse widths of the clock signals and the falling timing of the clock pulses are changed depending on which address signal is changed; (3) there is a case when a plurality of address signals (bits) are changed almost simultaneously but with slightly different timings, and, in this case, since the clock width is a logical sum of the plurality of pulses, the pulse width has a tendency to expand because the pulse widths generated by the respective changes of the address signals are not always the same.

It is not preferable, in order to ensure the short- circuiting of the pair of bit lines and so forth, that the clock pulse width vary depending on which of the input signals or which of the input address signals changes. Therefore, for the above-mentioned reset of the bit line pair or of the sense amplifier, the clock signal is preferred to have a constant pulse width and constant falling and rising timings in response to each change of the input signals.

SUMMARY OF THE INVENTION

An object of the present invention is to provide a semiconductor circuit which can provide a pulse with a constant pulse width in response to each change of input signals.

To attain the above object, there is provided, according to the present invention, a semiconductor circuit including: at least one input-change detecting circuit having a first output end for generating a pulse in response to a change of an input signal; a gate circuit, having an input end operatively connected to the first output end and having a second output end, for changing the signal at the second output end when the input signal changes; and a pulse-width fixing circuit for latching the output signal of the gate circuit in response to a signal change at the second output end of the gate circuit and, a predetermined time after the latching, for resetting the output signal.

BRIEF DESCRIPTION OF THE DRAWINGS

The above object and features of the present invention will be more apparent from the following description of the embodiments with reference to the drawings, wherein:

FIG. 3 is a circuit diagram of a clock signal generating circuit included in the circuit shown in FIG. 2;

FIGS. 4A through 4F are waveform diagrams for explaining the operation of the circuit shown in FIG. 3;

DESCRIPTION OF THE PREFERRED EMBODIMENTS

Figure 1:
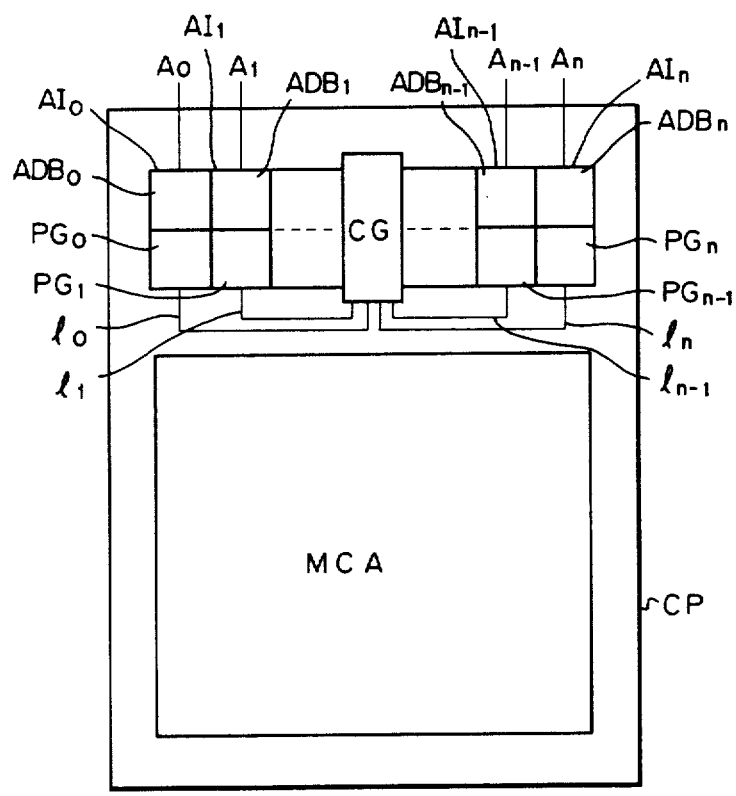
FIG. 1 is a block diagram of a semiconductor memory chip for explaining the background of the present invention.

FIG. 1 is a plan view of a semiconductor memory chip. In FIG. 1, the semiconductor memory chip CP has a memory cell array MCA, a plurality of address inverters $AI_0$, $AI_1$, ..., and $AI_n$, and a clock signal generating circuit CG. Each of the address inverters $AI_0$, $AI_1$, ..., and $AI_n$ consists of an address buffer circuit $ADB_i$ and a pulse generating circuit $PG_i$, where $i=0, 1, ...,$ on n. The address buffer circuit $ADB_i$ receives an address signal $A_i$ to provide a waveform shaped address signal. The pulse generating circuit $PG_i$ generates a pulse in response to a change in the address signal $A_i$. The outputs of the pulse generating circuits $PG_0$, $PG_1$, ..., and $PG_n$ are connected through conducting lines $l_0, l_1, ...,$ and $l_n$ to the inputs of the clock signal generating circuit CG.

Since the lengths of the conducting lines $l_0, l_1, ...,$ and $l_n$ are different from each other, the times necessary to transfer the signals from the pulse generating circuits $PG_0$, $PG_1$, ..., and $PG_n$ to the clock signal generating circuit CG are slightly different from each other. This causes the problem of different timings of the generation of the clock signals output from the clock signal generating circuit, as mentioned before.

Figure 2:
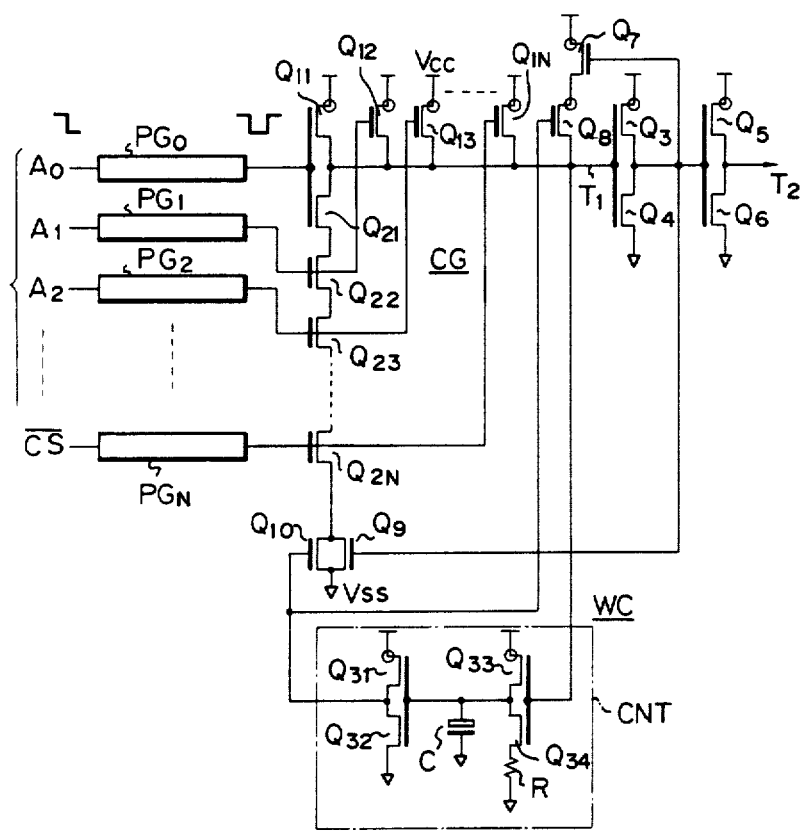
FIG. 2 is a circuit diagram of a semiconductor circuit according to an embodiment of the present invention.

FIG. 2 is a circuit diagram of a semiconductor circuit according to an embodiment of the present invention. In FIG. 2, $A_0, A_1, A_2, ...$ are bits of an address for accessing a static memory, and $PG_0, PG_1, PG_2, ...$ are pulse generating circuits provided in address inverters $AI_0, AI_1, ...$ (FIG. 1) which receive respective bits $A_0, A_1, ...$ of the address. Each pulse generating circuit $PG_i(i=0, 1, 2, ...)$ outputs a pulse having a relatively indefinite width of a low level (hereinafter referred to as L) when the corresponding address bit $A_i$ changes from a high level (H) to L or from L to H. $PG_n$ is a pulse generating circuit which outputs a pulse when a chip select signal $\overline{CS}$ drops from the H level to the L level.

The outputs of the pulse generating circuits $PG_0$, $PG_1$, $PG_2$, ..., and $PG_n$ are connected to the gate electrodes of pairs of transistors $Q_{11}$ and $Q_{21}$, $Q_{12}$ and $Q_{22}$, $Q_{13}$ and $Q_{23}$, ..., and $Q_{1n}$ and $Q_{2n}$, respectively. The pairs of transistors $Q_{11}$ and $Q_{21}$, $Q_{12}$ and $Q_{22}$, $Q_{13}$ and $Q_{23}$, ..., and $Q_{1n}$ and $Q_{2n}$ each forms a complementary metal oxide semiconductor (CMOS) inverter gate. These CMOS inverter gates constitute a clock signal generating circuit CG of a NAND gate functioning as an OR gate with respect to the L level of at least one of the input signals. That is, when at least one of the pulse generating circuits $PG_0$, $PG_1$, ..., and $PG_n$ generates the pulse of the L level, the clock signal generating circuit CG outputs the H level at its output $T_1$. Since the clock signal generating circuit CG is a NAND gate, when all of the inputs are at the H level, the level of an output end $T_1$ becomes L. If at least one input is L, the level of the output end $T_1$ becomes H. Note that the transistors $Q_{11}, Q_{12}, ...,$ and $Q_{1n}$, which have sources connected to a power supply $V_{CC}$ and illustrated by small circles in the figure, are P-channel metal oxide semiconductor (MOS) transistors. The transistors $Q_{21}, Q_{22}, ...,$ and $Q_{2n}$ without the small circles are N-channel MOS transistors. The N-channel MOS transistors $Q_{21}, Q_{22}, ...,$ and $Q_{2n}$ are connected in series. There are the same number of pairs of the P-channel and N-channel MOS transistors $Q_{11}$ and $Q_{21}$, $Q_{12}$ and $Q_{22}$, ..., and $Q_{1n}$ and $Q_{2n}$ as pulse generating circuits $PG_0, PG_1, ...,$ and $PG_n$. To the output end $T_1$, two CMOS inverter gates consisting of P-channel MOS transistors $Q_3$ and $Q_5$ and N-channel MOS transistors $Q_4$ and $Q_6$ are connected. Thus, a node $T_2$ of the CMOS inverter consisting of the transistors $Q_5$ and $Q_6$ becomes an output end of the clock signal generating circuit CG. In conventional circuits, only the pulse generating circuits $PG_0, PG_1, ...,$ and $PG_n$ and the clock signal generating circuit CG are provided, whereby a clock signal is generated from the output end $T_2$ whenever any address bit $A_0, A_1, ...$ changes or the chip select signal $\overline{CS}$ falls. However, as mentioned before, there was a problem in that the pulse width, particularly the end time (here, the rising edge), of the clock signal generated by the conventional clock signal generating circuit was not always constant.

The generating timings (here, the falling edge) of the clock signals of the pulse generating circuits $PG_1, PG_2, ...$ are relatively constant. The fluctuations occur in the end timings (here, the rising edge). Because of these fluctuations, the pulse width of the output clock signal was not always constant.

In the present invention, the clock signal generating circuit CG is provided with a circuit WC for making the output pulse width constant. The circuit WC consists of a latch and reset circuit and a control circuit CNT. The latch and reset circuit is constructed by P-channel MOS transistors $Q_7$ and $W_8$, connected in series between the power supply terminal $V_{CC}$ and the output end $T_1$ of the NAND gate, and N-channel MOS transistors $Q_9$ and $Q_{10}$ connected in parallel between the source of the transistor $Q_{2n}$ and the ground power supply $V_{SS}$. The control circuit CNT is constructed by P-channel MOS transistors $Q_{31}$ and $Q_{33}$, N-channel MOS transistors $Q_{32}$ and $Q_{34}$, a resistor R, and a MOS capacitor C, the last two forming an RC delay circuit, as shown in FIG. 2.

FIG. 3 is a circuit diagram of the clock signal generating circuit CG and the pulse width fixing circuit WC included in the circuit shown in FIG. 2. Referring to FIG. 3, in the latch and reset circuit formed by the P-channel MOS transistors $Q_7$ and $Q_8$ and the N-channel MOS transistors $Q_9$ and $Q_{10}$, the gate of the transistor $Q_7$ is connected to the output end (node 2 ) of the inverter formed by the trasistors $Q_3$ and $Q_4$. The gate of the transistor $Q_8$ is connected to the output end (node 4 ) of the control circuit CNT. The gate of the transistor $Q_9$ is connected to the output end (node 2 ) of the CMOS inverter formed by the transistors $Q_3$ and $Q_4$. The gate of the transistor $Q_{10}$ is connected to the output end (node 4 ) of the control circuit CNT. In the control circuit CNT, the transistors $Q_{33}$ and $Q_{34}$ form one CMOS inverter, and the transistors $Q_{31}$ and $Q_{32}$ form another. The gates of the transistors $Q_{33}$ and $Q_{34}$ function as an input end of the control circuit CNT and are connected to the output end $T_1$ of the NAND gate. The output of the CMOS inverter formed by the transistors $Q_{33}$ and $Q_{34}$ is connected to the gates of the transistors $Q_{31}$ and $Q_{32}$. The source of the transistor $Q_{34}$ is connected through the resistor R to the ground power supply terminal $V_{SS}$. Between the output of the CMOS inverter formed by the transistor $Q_{33}$ and $Q_{34}$ and the ground power supply terminal $V_{SS}$, the CMOS capacitor C is connected. The output of the CMOS inverter formed by the transistors $Q_{31}$ and $Q_{32}$ functions as the output of the control circuit CNT.

FIGS. 4A through 4F show the potential changes in respective portions in the circuit shown in FIG. 3. In FIGS. 4A–4F, $\phi_0$ and $\phi_1$ represent pulses generated by the pulse generating circuits $PG_0$ and $PG_1$; and ①, ②, ③, and ④ represent potential changes of the nodes ①, ②, ③, and ④ in the circuit shown in FIG. 3.

The operation of the circuit shown in FIG. 3 will be described with reference to FIGS. 4A to 4F. In a state when no change occurs in any address bit or the chip select bit $\overline{CS}$, the output signals $\phi_0$, $\phi_1$, ... of the all pulse generating circuits $PG_0$, $PG_1$, ... and $PG_n$ are at the H level so that, as illustrated in FIG. 3 and in FIG. 4C, the node $T_1$ is L; the output ② of the inverter formed by the transistors $Q_3$ and $Q_4$ is H, as shown in FIGS. 3 and 4D. Accordingly, the transistor $Q_7$ is OFF; the transistor $Q_9$ is ON; the output ③ of the CMOS inverter formed by the transistors $Q_{33}$ and $Q_{34}$ is H, as shown in FIG. 4E; the capacitor C is charged to $V_{CC}$; the output ④ of the inverter formed by the transistors $Q_{31}$ and $Q_{32}$ is L, as shown in FIG. 4F. Accordingly, the transistor $Q_8$ is ON and the transistor $Q_{10}$ is OFF. In the transistors $Q_7$ and $Q_8$, since the transistor $Q_7$ is OFF, the node $T_1$ *is not pulled up to VCC*. Also, in the transistors $Q_9$ and $Q_{10}$, since the transistor $Q_9$ is ON, the transistors $Q_{21}$, $Q_{22}$, ... and $Q_{2n}$ connected in series in the NAND gate, are connected through the transistor $Q_9$ to the ground power supply terminal $V_{SS}$.

In this state, when either of the address bits, for example, $A_1$, is changed so that a pulse 1 falls from H to L at a time $t_1$ as illustrated in FIG. 4B, the NAND gate generates H so that node $T_1$ becomes H as shown in FIG. 4C, and the output ② of the inverter formed by the transistors $Q_3$ and $Q_4$ becomes L. Therefore, the P-channel transistor $Q_7$ turns ON so that the node $T_1$ is pulled up to $V_{CC}$ *by the transistors $Q_7$* and $Q_8$; and the transistor $Q_9$ turns OFF so that the source of the transistor $Q_{2n}$ is inhibited from being pulled down to $V_{SS}$. Thus, the node ② of the clock signal generating circuit CG is latched to L; and, accordingly, the output end $T_2$ is latched to H. In this state also, the output ③ of the inverter formed by the transistors $Q_{33}$ and $Q_{34}$ gradually decreases to L; and the output ④ of the inverter formed by the transistors $Q_{31}$ and $Q_{32}$ becomes H at a time $t_2$ when the level at the node ③ becomes lower than the threshold voltage of the P-channel transistor $Q_{31}$. Since the RC delay circuit formed by the resistor R and the capacitor C is included, the change of the level at the node ④ includes the time delay td. When the output ④ of the inverter formed by the transistors $Q_{31}$ and $Q_{32}$ becomes H after this delay, the P-channel transistor $Q_8$ turns OFF at a time $t_3$ so that the above-mentioned pulling up of the node $T_1$ is stopped, i.e., the latch is released; and the N-channel transistor $Q_{10}$ turns ON in response to the H level at the node ④ so that the transistors $Q_{21}$, $Q_{22}$, ... and $Q_{2n}$ connected in series are connected through the transistor $Q_{10}$ to $V_{SS}$. Accordingly, as long as the pulses from the pulse generating circuits are not present, that is, under the condition that all of the output signals $\phi_0$, $\phi_1$, ... output from the pulse generating circuits $PG_0$, $PG_1$, ..., and $PG_n$ are at the H level, the node $T_1$ is pulled down to $V_{SS}$ (L level), and, therefore, the node ② is raised to the H level at the time $t_3$ as shown in FIG. 4D. Thus, the output clock width of the clock signal generating circuit CG becomes a constant value determined by the RC time constant. Even when there are differences in the reset timings of the pulse $\phi_1$, as illustrated by arrows in FIG. 4B, the output clock pulse at the node ② has a constant pulse width T.

There is a possibility of generation of two or more pulses output at slightly different timings from the pulse generating circuits $PG_0$, $PG_1$, ... and $PG_n$. As an example, FIGS. 4A and 4B show the two pulses $\phi_0$ and $\phi_1$ generated at different timings $t_1$ and $t_4$ from the pulse generating circuits $PG_0$ and $PG_1$. In this case, the pulse width of the pulse at the node ② is elongated, and, at the maximum, the pulse at the node ② terminates at a time $t_5$. The time period between the times $t_4$ and $t_5$ is equal to the time T determined by the RC delay circuit. The pulse at the node ② may be terminated before the time $t_5$ if the capacitor C is not fully charged at the time $t_4$.

Figure 5:
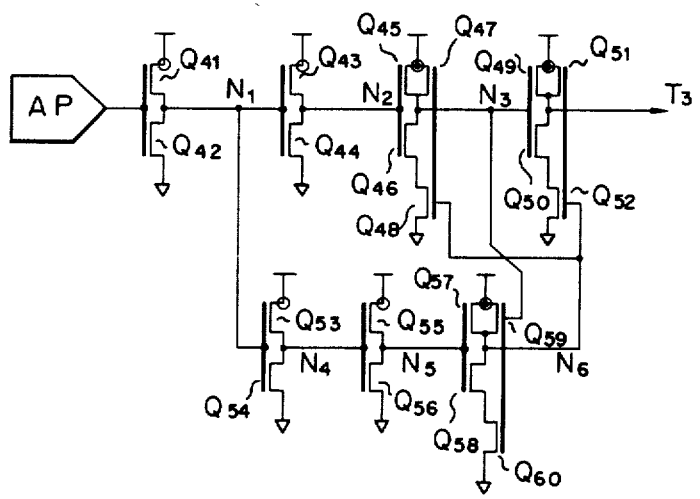
FIG. 5 is a circuit diagram illustrating an example of a pulse generating circuit included in the circuit shown in FIG. 2.

FIG. 5 shows an example of one of the pulse generating circuits $PG_0$, $PG_1$, ..., $PG_{n-1}$, i.e., excluding the circuit $PG_n$ which receives the chip select signal CS. In FIG. 5, AP is an input pad to which one of the address bits $A_0$, $A_1$, $A_2$, ... is applied; $Q_{41}$, $Q_{43}$, $Q_{45}$, $Q_{47}$, $Q_{49}$, $Q_{51}$, $Q_{53}$, $Q_{55}$, $Q_{57}$, and $Q_{59}$ are P-channel MOS transistors; and $Q_{42}$, $Q_{44}$, $Q_{46}$, $Q_{48}$, $Q_{50}$, $Q_{52}$, $Q_{54}$, $Q_{56}$, $Q_{58}$, and $Q_{60}$ are N-channel MOS transistors. Pairs of transistors $Q_{41}$ and $Q_{42}$, $Q_{43}$ and $Q_{44}$, $Q_{53}$ and $Q_{54}$, and $Q_{55}$ and $Q_{56}$, constitute CMOS inverters, respectively. Groups of transistors $Q_{45}$, $Q_{46}$, $Q_{47}$ and $Q_{48}$; $Q_{49}$, $Q_{50}$, $Q_{51}$ and $Q_{52}$; and $Q_{57}$, $Q_{58}$, $Q_{59}$ and $Q_{60}$ constitute CMOS NAND gates, respectively.

The mutual conductances gm of the transistors $Q_{46}$, $Q_{48}$, $Q_{58}$ and $Q_{60}$ are made to be relatively small. On the contrary, the mutual conductances gm of the transistors $Q_{50}$ and $Q_{52}$ are made to be relatively large. Since the mutual conductances gm of the transistors $Q_{50}$ and $Q_{52}$ are relatively large, the output pulse $\phi$ at the node $T_3$ falls rapidly in response to a change of an address bit applied to the input pad AP. Also, since the mutual conductances gm of the transistors $Q_{46}$, $Q_{48}$, $Q_{58}$ and $Q_{60}$ are relatively small, the output pulse $\phi$ at the node $N_3$ rises a predetermined time later from the change of the address bit applied to the input pad AP.

In more detail, for example, when the potential at the input pad AP is at H, then the node $N_1$ is L; the node $N_2$ is H; the transistor $Q_{46}$ is ON; the node $N_4$ is H; the node $N_5$ is L; the node $N_6$ is H; the transistor $Q_{48}$ is ON; and, accordingly, the node $N_3$ is L and the output end $T_3$ is H. In this state, the node $N_4$ is H; the node $N_5$ is L; and the node $N_6$ is H; and the transistor $Q_{52}$ is on. From this state, when the address bit applied to the input pad AP turns to L, then the node $N_1$ becomes H; the node $N_2$ becomes L; the node $N_3$ becomes H; and the transistor $Q_{50}$ turns ON. Because of its large gm, the output end $T_3$ rapidly turns to the L level. Also, the node $N_4$ turns to L, and the node $N_5$ turns to H. The transistors $Q_{58}$ and $Q_{60}$ turn ON in response to the H levels at the nodes $N_5$ and $N_3$, respectively. However, since the mutual conductances of the transistors $Q_{58}$ and $Q_{60}$ are relatively small, the node $N_6$ gradually turns to the L level. Therefore, in response to the rapid operation of the transistor $Q_{50}$, the output end $T_3$ rapidly turns to the L level in response to a fall of the applied address bit. When the transistors $Q_{58}$ and $Q_{60}$ turn ON, the node $N_6$ gradually turns to the L level so that the transistor $Q_{52}$ becomes OFF. Thus, a predetermined time after the fall of the address bit, the output end $T_3$ rises again to the H level. The pulse width of the pulse obtained at the output end $T_3$ of the pulse generating circuit PG is determined by the values of the mutual conductances gm of the transistors $Q_{50}$, $Q_{52}$, $Q_{58}$, and $Q_{60}$.

Similarly, when the potential at the input pad AP changes from L to H, a pulse having a pulse width corresponding to the difference in the mutual conductances gm of the transistors $Q_{50}$, $Q_{52}$ and $Q_{46}$, $Q_{48}$ is output at the output end $T_3$.

Since the mutual conductances gm of the transistors can not be determined accurately in the manufacturing process, the pulse width of the pulse at the output end $T_3$ is relatively indefinite because the timing of the rising edge is indefinite. Therefore, as illustrated in FIG. 4B by the arrows, the end of the pulse $\phi_1$ is indefinite. This is the reason why the pulse generating circuit CG including the circuit WC as shown in FIG. 2 is necessary. Using the circuit shown in FIG. 2, a constant pulse width can be obtained regardless of the pulse widths applied from the pulse generating circuits $PG_0$, $PG_1$, . . . , and $PG_n$.

Figure 6:
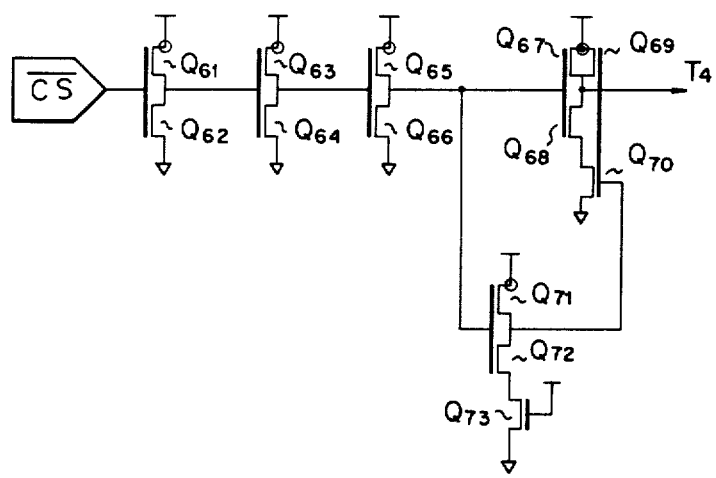
FIG. 6 is a circuit diagram illustrating another example of a pulse generating circuit included in the circuit shown in FIG. 2.

FIG. 6 is a circuit diagram showing an example of the pulse generating circuit $PG_n$ shown in FIG. 2. In FIG. 6, the circuit $PG_n$ includes pairs of P-channel and N-channel transistors $Q_{61}$ and $Q_{62}$, $Q_{63}$ and $Q_{64}$, $Q_{65}$ and $Q_{66}$, and $Q_{71}$ and $Q_{72}$ which respectively constitute CMOS inverters. $Q_{69}$ is a P-channel transistor, and $Q_{70}$ and $Q_{73}$ are N-channel transistors. $Q_{67}$, $Q_{68}$, $Q_{69}$ and $Q_{70}$ constitute a CMOS NAND gate. This circuit $PG_n$ also generates a pulse at an output end $T_4$ in response to a change from H to L of the chip select signal $\overline{CS}$.

The pulse generating circuits $PG_0$, $PG_1$, . . . , and $PG_n$ are not restricted to those for receiving the address bits $A_0$, $A_1$, $A_2$, . . . and the chip select signal $\overline{CS}$. For example, a static random-access memory (RAM) is known in which a predetermined time after an address change, the selected word line is turned to the nonselected state (L level) to save power. In this case, when a write instruction is applied, the above-mentioned selected word line must be set to the H level during a necessary time. To do this, the pulse generating circuit must generate a pulse in response to a write enable signal $\overline{WE}$.

The clock signal generating circuit CG is not restricted to the circuit shown in FIG. 2. Various variations are possible within the scope of the present invention. For example, the number of the CMOS inverters in the clock signal generating circuit may be arbitrarily selected in accordance with the desired output. If a pulse of H level is necessary, an additional inverter may be added. If a clock signal must be generated in response to a change from L to H of an input signal, this is also possible to those skilled in the art based on the circuit shown in FIG. 2. Further, in place of connecting the node $T_1$ to the gates of the transistors $Q_{33}$ and $Q_{34}$, the output of the inverter formed by the transistors $Q_3$ and $Q_4$ may be connected through an additional CMOS inverter to the gates of the transistors $Q_{33}$ and $Q_{34}$, or the output end $T_2$ may be connected to the gates of the transistors $Q_{33}$ and $Q_{34}$. Still further, in place of the output end $T_2$, the output of the CMOS inverter formed by the transistors $Q_3$ and $Q_4$ may be used as the output end of the clock signal generating circuit CG.

From the foregoing description, it will be apparent that, according to the present invention, a clock signal having a constant pulse width regardless of the pulse widths of the input signals can be generated, which is effective for use in a static memory.

I claim:

1. A semiconductor circuit operatively connected to a power supply having first and second terminals of opposite polarity, comprising:
   at least one input-change detecting circuit, operatively connected to the first and second terminals of the power supply, having a first output end for generating a pulse in response to a change of an input signal;
   a gate circuit, operatively connected to the first and second terminals of the power supply, having an input end operatively connected to said first output end and having a second output end, for changing an output signal when the input signal changes;
   an inverter, operatively connected to said second output end and the first and second terminals of the power supply, having a third output end; and
   a pulse-width fixing circuit, operatively connected to the first and second terminals of the power supply and said second output end of said gate circuit, for latching the output signal of said gate circuit in response to a signal change at said second output end of said gate circuit and for resetting the output signal a predetermined time after the onset of the latching, comprising:
   first and second transistors connected in series between the first terminal of the power supply and said second output end of said gate circuit, said first and second transistors having gate electrodes, the gate electrode of said first transistor operatively connected to said third output end;
   reset means, operatively connected to the gate electrode of said second transistor, for resetting the latching after a predetermined time delay from the onset of the latching; and
   a control circuit, operatively connected to the first and second terminals of the power supply, having an input end connected to said second output end and having a reset output end connected to said reset means, said control circuit including a delay circuit for transferring a signal change at said input end of said control circuit to said reset output end with the predetermined time delay to control said reset means.

2. A semiconductor circuit as set forth in claim 1, wherein said input-change detecting circuit is operatively connected to receive an address signal for accessing a memory device.

3. A semiconductor circuit as set forth in claim 1, wherein said input-change detecting circuit is operatively connected to receive a chip select signal for selecting a memory chip of a memory device.

4. A semiconductor circuit as set forth in claim 1,
   wherein said semiconductor circuit further comprises a memory device, operatively connected to the power supply and to said gate circuit, for performing a write operation, and
   wherein said input-change detecting circuit is operatively connected to receive a write enable signal for enabling the write operation of the memory device.

5. A semiconductor circuit as set forth in claim 1, wherein said pulse-width fixing circuit generates a pulse having a constant pulse width.

6. A semiconductor circuit as set forth in claim 1, wherein said resetting means comprises:
   a third transistor having a gate electrode connected to said third output end of said inverter; and
   a fourth transistor having a gate electrode connected to said reset output end of said control circuit, said third and fourth transistors being connected in parallel between said gate circuit and the second terminal of the power supply.

7. A semiconductor circuit as set forth in claim 6, wherein said control circuit comprises:
   a first inverter, operatively connected to the first terminal of the power supply, having an input end connected to said second output end of said gate circuit and having a fourth output end;
   a second inverter, operatively connected to the first and second terminals of the power supply, having an input end connected to the fourth output end of said first inverter and having an output end connected to the gate electrodes of said second transistor and said fourth transistor;
   a resistor connected between said first inverter and the second terminal of the power supply; and
   a capacitor connected between the fourth output end of said first inverter and the ground power supply, said resistor and said capacitor forming said delay circuit.

8. A semiconductor circuit operatively connected to a power supply, comprising:
   at least one input-change detecting circuit, operatively connected to the power supply, having a first output end for generating a pulse in response to a change of an input signal;
   a gate circuit, operatively connected to the power supply, having an input end operatively connected to said first output end and having a second output end, for changing an output signal when the input signal changes; and
   a pulse-width fixing circuit, operatively connected to the power supply and said second output end of said gate circuit, for latching the output signal of said gate circuit in response to a signal change at said second output end of said gate circuit and for resetting the output signal a predetermined time after the onset of the latching, said pulse-width fixing circuit comprising:
   latching means for latching the signal change at said output end;
   a control circuit, operatively connected to the power supply, having an input end connected to said output end of said gate circuit and having a reset output end, said control circuit including a delay circuit for transferring a signal change at said input end of said control circuit to said reset output end with a predetermined time delay; and
   first and second transistors connected in parallel between said gate circuit and the power supply, said first transistor having a control terminal operatively connected to said second output end and said second transistor having a control terminal operatively connected to said reset output end of said control circuit.

* * * * *

UNITED STATES PATENT AND TRADEMARK OFFICE
CERTIFICATE OF CORRECTION

PATENT NO. : 4,710,904
DATED : December 1, 1987
INVENTOR(S) : Suzuki

It is certified that error appears in the above-identified patent and that said Letters Patent is hereby corrected as shown below:

Col. 3, line 32 "$1_o, 1_1, \ldots,$ and $1_n$" should be --$\ell_o, \ell_1 \ldots,$ and $\ell_n$--;

line 34, "$1_o, 1_1$" should be --$\ell_o, \ell_1$--;

line 35, "$1_n$" should be --$\ell_n$--.

Signed and Sealed this

Fifth Day of July, 1988

Attest:

DONALD J. QUIGG

*Attesting Officer*     *Commissioner of Patents and Trademarks*